United States Patent
Gan

(10) Patent No.: US 10,267,840 B2
(45) Date of Patent: Apr. 23, 2019

(54) METHOD FOR TESTING INTER-LAYER CONNECTIONS

(71) Applicants: Semiconductor Manufacturing International (Beijing) Corporation, Beining (CN); Semiconductor Manufacturing International (Shanghai) Corporation, Shanghai (CN)

(72) Inventor: Zhenghao Gan, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 101 days.

(21) Appl. No.: 15/709,267

(22) Filed: Sep. 19, 2017

(65) Prior Publication Data
US 2018/0095122 A1     Apr. 5, 2018

(30) Foreign Application Priority Data

Sep. 30, 2016   (CN) .......................... 2016 1 0871107

(51) Int. Cl.
*G01R 31/02*     (2006.01)
*G01R 27/02*     (2006.01)
(Continued)

(52) U.S. Cl.
CPC .......... *G01R 31/026* (2013.01); *G01R 27/02* (2013.01); *G01R 31/31717* (2013.01);
(Continued)

(58) Field of Classification Search
CPC .............. G01R 31/26; G01R 31/31717; G01R 31/31855; G01R 27/02
See application file for complete search history.

(56) References Cited

U.S. PATENT DOCUMENTS 6,181,144 B1    1/2001  Hembree et al.
2005/0035774 A1  2/2005  Long
(Continued)

OTHER PUBLICATIONS

European Search Report corresponding to EP application No. 17186870, dated Feb. 19, 2018.

*Primary Examiner* — Tung X Nguyen
*Assistant Examiner* — Dominic E Hawkins
(74) *Attorney, Agent, or Firm* — Innovation Counsel LLP

(57) ABSTRACT

A method for testing inter-layer connections is presented. The method entails: providing a test semiconductor device, wherein the test semiconductor device comprises a two-port resistance network; measuring base input resistances on at least one of the first and the second ports of the test semiconductor device for different numbers of resistance links in a defect-free circumstance; obtaining a correspondence relationship between the number of resistance links and the base input resistances; measuring actual input resistances on at least one of the first and the second ports of the test semiconductor device; and determining a position of the resistance link corresponding to the actual input resistances based on the correspondence relationship, wherein the position of the resistance link determines the location of a defect. This method can promptly locate a defect in inter-layer components and can reduce test time and simplify test procedures.

20 Claims, 8 Drawing Sheets

(51) Int. Cl.
*H01L 23/522* (2006.01)
*G01R 31/3185* (2006.01)
*G01R 31/317* (2006.01)
*H01L 23/528* (2006.01)

(52) U.S. Cl.
CPC .... *G01R 31/31855* (2013.01); *H01L 23/5228* (2013.01); *H01L 23/528* (2013.01); *H01L 23/5226* (2013.01)

(56) References Cited

U.S. PATENT DOCUMENTS

| | | |
|---|---|---|
| 2008/0007368 A1 | 1/2008 | Kalb et al. |
| 2010/0004886 A1* | 1/2010 | Charlet ............... G06F 17/5063 702/65 |
| 2014/0013296 A1 | 1/2014 | Hayashi |
| 2016/0233865 A1* | 8/2016 | Tamura ............. H03K 19/0008 |

* cited by examiner

METHOD FOR TESTING INTER-LAYER CONNECTIONS

CROSS-REFERENCE TO RELATED APPLICATION

This application claims priority to and benefit of Chinese Patent Application No. 201610871107.2 filed on Sep. 30, 2016, which is incorporated herein by reference in its entirety.

BACKGROUND

(a) Field of the Invention

This inventive concept relates to semiconductor test techniques, more specifically, a method for testing inter-layer connections.

(b) Description of the Related Art

In conventional semiconductor manufacturing process, particularly in Back End Of Line (BEOL), electromigration and stress migration are two challenges for small devices. FIG. 1 shows a semiconductor device comprising a first connection layer 101 and a second connection layer 102. An inter-layer component 103 connects the first connection layer 101 to the second connection layer 102. Due to electromigration and stress migration, the inter-layer component 103 may have defects, such as a hole 104, that can cause open circuit.

To find a defect in inter-layer components, an ideal test method should have a high sensitivity and be able to promptly and accurately locate a defect in various inter-layer components including contact, via or other inter-layer structures, wherein the defect may be a cavity or other blemishes that can cause open circuit.

When an inter-layer component comprises multiple connection links, one defect in the connection links may cause open circuit in the connection. Under conventional test methods and test infrastructure, every node in the connection links need to be visited to locate the defect. For a connection containing a large number of connection links, that would require prolonged test time and could not promptly locate the defect. Therefore a test method that can promptly locate defects in inter-layer components is desirable.

SUMMARY

This summary is related to some of many embodiments of the inventive concept disclosed herein and is not intended to limit the scope of this inventive concept.

A method for testing inter-layer connections, comprising:
providing a test semiconductor device, wherein the test semiconductor device comprises a two-port resistance network connecting a first port and a second port of the test semiconductor device, wherein the two-port resistance network comprises a resistance chain comprising a plurality of resistance links that are serially connected, wherein each of the resistance links comprises:
a first node;
a second node;
a third node;
a fourth node;
a first equivalent resistance connecting the first node and the second node;
a second equivalent resistance connecting the third node and the fourth node; and
a jumper resistance connecting the second node and the third node,
wherein a last resistance link of the resistance chain further comprises:
a fifth node;
a sixth node;
a third equivalent resistance connecting the second node and the fifth node; and
a fourth equivalent resistance connecting the third node and the sixth node,
wherein each of the first, the second, the third, and the fourth equivalent resistances comprises resistances of inter-layer components,
and wherein the first port of the test semiconductor device comprises the first node and the fourth node of a first resistance link of the resistance chain, the second port of the test semiconductor device comprises the fifth node and the sixth node of the last resistance link of the resistance chain, and for all the resistance links except the last resistance link, the second node and the third node of a resistance link is connected to the first node and the fourth node of a next resistance link, respectively;
obtaining a correspondence relationship between a number of resistance links and base input resistances on at least one of the first and the second ports of the test semiconductor device, wherein the base input resistances are measured in a defect-free circumstance;
measuring actual input resistances on at least one of the first and the second ports of the test semiconductor device; and
determining a position of the resistance link corresponding to the actual input resistances based on the correspondence relationship, wherein the position of the resistance link determines a location of a defect.

Additionally, in the aforementioned method, the two-port resistance network may comprise a first sub-chain and a second sub-chain, wherein the first sub-chain and the second sub-chain each comprise a plurality of sub-links that are serially connected,
wherein each resistance link in the resistance chain may comprise a sub-link in the first sub-chain, a sub-link in the second sub-chain, and a jumper resistance, wherein the sub-link in the first sub-chain comprises:
a first sub-unit comprising a first portion of a first conductive layer;
a second sub-unit comprising a first portion of a second conductive layer; and
a third sub-unit comprising a first inter-layer component connecting the first sub-unit and the second sub-unit, wherein the first sub-unit, the second sub-unit, and the third sub-unit are serially connected and connecting the first node and the second node of the resistance link,
and wherein the sub-links in the second sub-chain may comprise:
a first sub-unit comprising a second portion of the first conductive layer;
a second sub-unit comprising a second portion of the second conductive layer; and
a third sub-unit comprising a second inter-layer component connecting the first sub-unit and the second sub-unit, wherein the first sub-unit, the second sub-unit, and the third sub-unit are serially connected and connecting the third node and the fourth node of the resistance link.

Additionally, in the aforementioned method, the first equivalent resistance in each of the resistance links may comprise a resistance of the first inter-layer component of the sub-link in the first sub-chain, the second equivalent resistance in each of the resistance links may comprise a resistance of the second inter-layer component of the sub-link in the second sub-chain.

Additionally, in the aforementioned method, the two-port resistance network may comprise a first sub-chain and a second sub-chain, wherein the first sub-chain and the second sub-chain may each comprise a plurality of sub-links that are serially connected, wherein each of the resistance links may comprise a sub-link in the first sub-chain, a sub-link in the second sub-chain, and a jumper resistance, wherein the sub-link in the first sub-chain may comprise:
- a first sub-unit comprising a first portion of a first conductive layer contacting the first node of the resistance link;
- a second sub-unit comprising a first portion of a second conductive layer;
- a third sub-unit comprising a second portion of the first conductive layer contacting the second node of the resistance link;
- a fourth sub-unit comprising a first inter-layer component connecting the first sub-unit and the second sub-unit; and
- a fifth sub-unit comprising a second inter-layer component connecting the second sub-unit and the third sub-unit, and wherein the sub-link in the second sub-chain may comprise:
- a first sub-unit comprising a third portion of the first conductive layer contacting the fourth node of the resistance link;
- a second sub-unit comprising a second portion of the second conductive layer;
- a third sub-unit comprising a fourth portion of the first conductive layer contacting the third node of the resistance link;
- a fourth sub-unit comprising a third inter-layer component connecting the first sub-unit and the second sub-unit; and
- a fifth sub-unit comprising a fourth inter-layer component connecting the second sub-unit and the third sub-unit.

Additionally, in the aforementioned method, the first equivalent resistance in each of the resistance links may comprise resistances of the first and the second inter-layer components of the sub-link in the first sub-chain, the second equivalent resistance in each of the resistance links may comprise resistances of the third and the fourth inter-layer components of the sub-link in the second sub-chain.

Additionally, in the aforementioned method, the first equivalent resistance and the second equivalent resistance in each of the resistance links may be substantially the same and both equal to a unit resistance, the jumper resistance may be m times the first equivalent resistance wherein m is a positive number, and wherein obtaining the correspondence relationship between the number of resistance links and the base input resistances on at least one of the first and the second ports of the test semiconductor device may comprise:
- measuring the base input resistances on at least one of the first and the second ports of the test semiconductor device for different number of resistance links in a defect-free circumstance; and
- obtaining the correspondence relationship between the number of resistance links and a ratio of the base input resistances to the unit resistance.

Additionally, in the aforementioned method, the first equivalent resistance and the second equivalent resistance in each of the resistance links may be substantially the same and both equal to a unit resistance, the jumper resistance may equal to the first equivalent resistance multiplied by a coefficient $k(i)$, wherein i is an integer representing a position of a resistance link in the resistance chain and is greater than or equal to 1 but less than or equal to the total number of resistance links N, wherein the coefficient $k(i)$ satisfies the following conditions:

when $i=1$, $k(i)=m$, wherein $m>0$;
when $2 \leq i \leq s$, wherein s is an integer and $2<s<N$, $k(i)$ has a negative correlation with i, that is, $k(i)$ decreases as i increases;
when $s<i \leq N-1$, $k(i)$ has a positive correlation with i, that is, $k(i)$ increases as i increases; and
when $i=N$, $k(i)=m$.

Additionally, in the aforementioned method, the coefficient $k(i)$ in each of the resistance links may further satisfy the following conditions:

when $2 \leq i \leq s$, $k(i)=-a*i+b$;
when $s<i \leq N-1$, $k(i)=a*(N-i)+b$, wherein $a>0$, $b>0$, and $-a*s+b=m$.

Additionally, in the aforementioned method, obtaining the correspondence relationship between the number of resistance links and the base input resistances on at least one of the first and the second ports of the test semiconductor device may comprise:
- measuring the base input resistances on the first port of the test semiconductor device for different number of resistance links in a defect-free circumstance; and
- obtaining the correspondence relationship between the number of resistance links and the base input resistances on the first port of the test semiconductor device, and wherein measuring the actual input resistances on at least one of the first and the second ports of the test semiconductor device may comprise:
- measuring the actual input resistance on the first port of the test semiconductor device.

Additionally, in the aforementioned method, obtaining the correspondence relationship between the number of resistance links and the base input resistances on at least one of the first and the second ports of the test semiconductor device may comprise:
- measuring the base input resistances on the first and the second ports of the test semiconductor device for different number of resistance links in a defect-free circumstance; and
- obtaining the correspondence relationship between the number of resistance links and the base input resistances on the first and the second ports of the test semiconductor device, wherein measuring the actual input resistances on at least one of the first and the second ports of the test semiconductor device may comprise:
- measuring the actual input resistances on the first and second ports of the test semiconductor device, and wherein determining the position of the resistance link corresponding to the actual input resistances based on the correspondence relationship may comprise:

comparing the actual input resistance on the first port and the base input resistances on the first port to determine the position of the resistance link corresponding to the actual input resistance on the first port of the test semiconductor device; and comparing the actual input resistance on the second port and the base input resistances on the second port to determine the position of the resistance link corresponding to the actual input resistance on the second port of the test semiconductor device.

Additionally, in the aforementioned method, determining the position of the resistance link corresponding to the actual input resistances based on the correspondence relationship may comprise:

when the actual input resistance and a base input resistance at a given number of resistance links satisfies a condition, the given number of resistance links is the position of the resistance link corresponding to the actual input resistance.

Additionally, in the aforementioned method, the correspondence relationship may be represented by either a curve or a lookup table.

Additionally, in the aforementioned method, the condition may comprise:

the ratio of a first number to the actual input resistance is less than a threshold, wherein the first number is an absolute value of the difference between the actual input resistance and the base input resistance at a given number of resistance links.

Additionally, in the aforementioned method, if the position of the resistance link corresponding to the actual input resistance is not a position of the last resistance link, the defect may be located on a next resistance link that is serially connected to the resistance link corresponding to the actual input resistance.

Additionally, in the aforementioned method, if the the position of the resistance link corresponding to the actual input resistance is a position of the last resistance link or is larger than a threshold, the method may further comprise:

a second measure procedure comprising measuring a second actual input resistance on the second port of the test semiconductor device; and determining a position of a resistance link corresponding to the second actual input resistance based on the correspondence relationship.

Additionally, in the aforementioned method, obtaining the correspondence relationship between the number of resistance links and the base input resistances on at least one of the first and the second ports of the test semiconductor device may further comprise:

measuring the base input resistances on the first and the second ports of the test semiconductor device for different number of resistance links in a defect-free circumstance; and obtaining the correspondence relationship between the number of resistance links and a ratio of the difference between the base input resistances on the first and the second ports of the test semiconductor device to a unit resistance, wherein measuring the actual input resistances on at least one of the first and the second ports of the test semiconductor device may comprise:

measuring the actual input resistances on the first and the second ports of the test semiconductor device, and wherein determining the position of the resistance link corresponding to the actual input resistance based on the correspondence relationship may comprise:

comparing the ratio of the different between the actual input resistances in the first and the second ports of the test semiconductor device to the unit resistance and the ratios of the differences between the base input resistances on the first and the second ports of the test semiconductor device to the unit resistance to determine the position of the resistance link corresponding to the actual input resistances on the first and the second ports of the test semiconductor device.

Additionally, in the aforementioned method, the defect may comprise a cavity in the inter-layer components.

Additionally, in the aforementioned method, the defect may comprise an open circuit in the inter-layer components.

Additionally, in the aforementioned method, each of the first conductive layer and the second conductive layer may be an active layer or a metal-wired layer.

Additionally, in the aforementioned method, the jumper resistance, the first conductive layer, and the second conductive layer in each of the resistance links may be made of a same material.

DETAILED DESCRIPTION OF THE EMBODIMENTS

Figure 1:
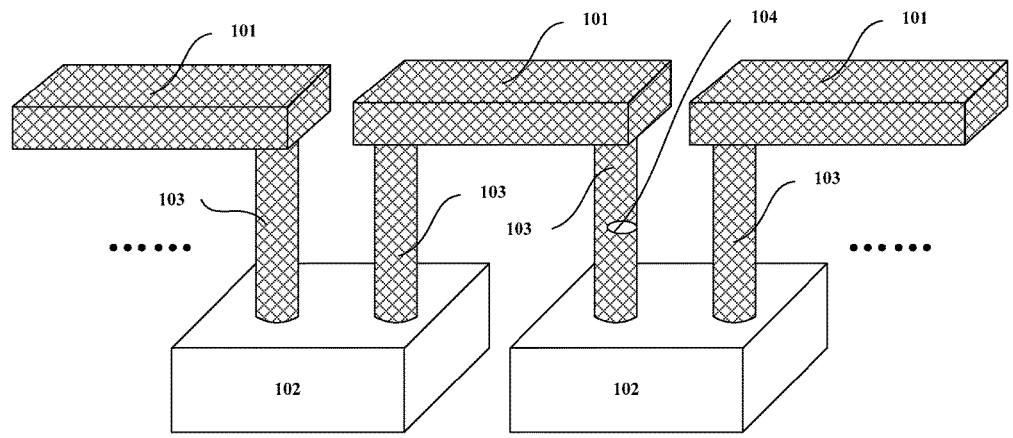
FIG. 1 shows a diagram of a conventional semiconductor device with a defect in an inter-layer component.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2:
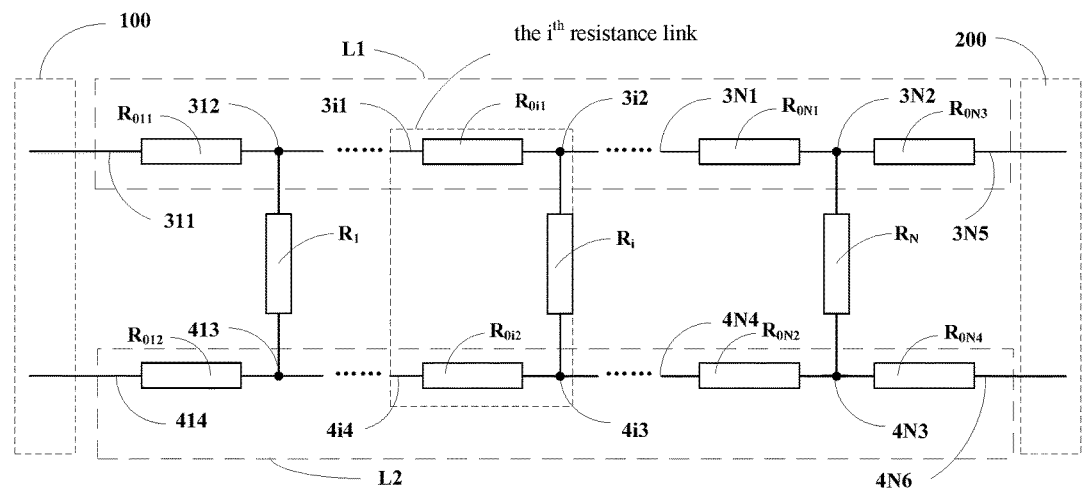
FIG. 2 shows a circuit diagram depicting a two-port resistance network used in a method for testing inter-layer connections in accordance with one or more embodiments of this inventive concept.
Figure 3A:
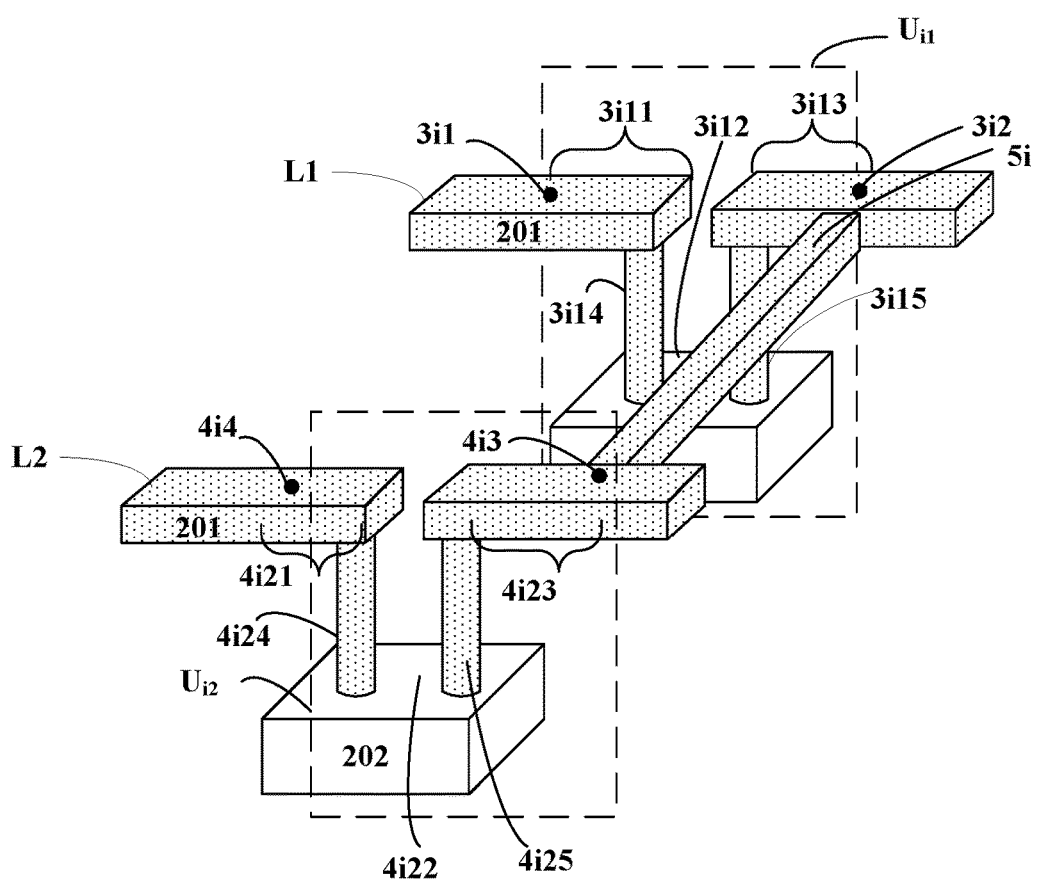
FIG. 3A and FIG. 3B show diagrams of semiconductor devices used in a method for testing inter-layer connections in accordance with two embodiments of this inventive concept, respectively.
Figure 3B:
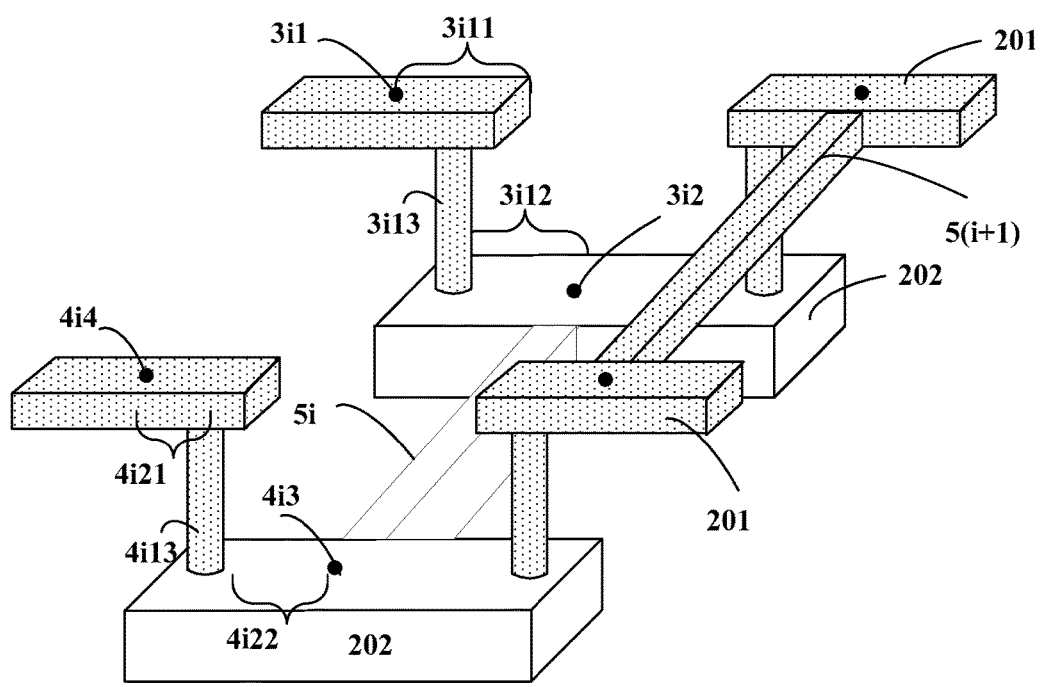
Figure 4:
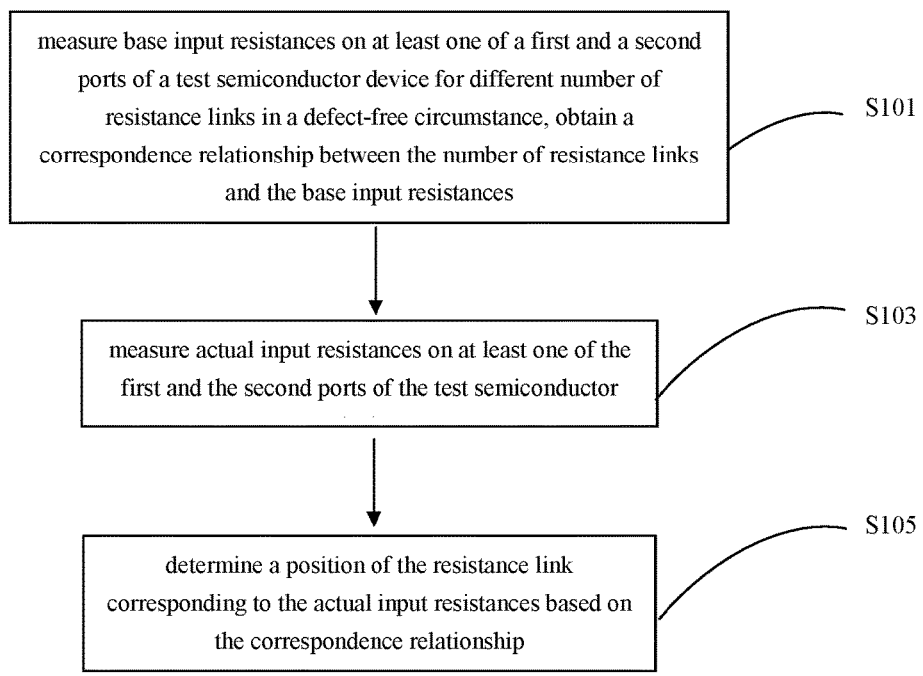
FIG. 4 shows a flowchart illustrating a method for testing inter-layer connections in accordance with one or more embodiments of this inventive concept.

FIG. 2 shows a circuit diagram depicting a two-port resistance network used in a method for testing inter-layer connections in accordance with one or more embodiments of this inventive concept. FIGS. 3A and 3B show diagrams of semiconductor devices used in a method for testing inter-layer connections in accordance with two embodiments of this inventive concept. FIG. 4 shows a flowchart illustrating a method for testing inter-layer connections in accordance with one or more embodiments of this inventive concept. Referring to FIGS. 2, 3A, 3B, and 4, a method for testing inter-layer connections in accordance with one or more embodiments of this inventive concept will be described below.

In one embodiment, this inventive concept comprises a test semiconductor device comprising a two-port resistance network as shown in FIG. 2.

Referring to FIG. 2, the two-port resistance network comprises a resistance chain comprising a plurality of resistance links that are serially connected and connecting a first port 100 and a second port 200 of the test semiconductor device, wherein a total number of resistance links is N. As shown in FIG. 2, each of the resistance links comprises a first node $3i1$, a second node $3i2$, a third node $4i3$, a fourth node $4i4$, a first equivalent resistance $R_{Oi1}$ connecting the first node $3i1$ and the second node $3i2$, a second equivalent resistance $R_{Oi2}$ connecting the third node $4i3$ and the fourth node $4i4$, and a jumper resistance $R_i$ connecting the second node $3i2$ and the third node $4i3$, wherein i is an integer representing a location of each resistance link and is in a range of from 1 to N with 1 representing the first resistance link and N representing the last resistance link.

Referring to FIG. 2, the last (the $N^{th}$) resistance link further comprises a fifth node 3N5, a sixth node 4N6, a third equivalent resistance $R_{ON3}$ connecting the second node 3N2 and the fifth node 3N5, and a fourth equivalent resistance $R_{ON4}$ connecting the third node 4N3 and the sixth node 4N6.

FIG. 3A shows a diagram depicting a physical structure of the two-port resistance network in a method for testing inter-layer connections in accordance with one embodiment of this inventive concept. In one embodiment, the two-port resistance network comprises a first sub-chain L1 and a second sub-chain L2. The first sub-chain L1 and the second sub-chain L2 each comprises a plurality of sub-links that are serially connected, both the first sub-chain L1 and the second sub-chain L2 have a number of sub-links that is equal to the number of resistance links N. The sub-links in the first sub-chain L1 and the second sub-chain L2 are annotated as $U_{i1}$ and $U_{i2}$, respectively, wherein i is an integer representing a location of each sub-link and is in a range of from 1 to N with 1 representing the first sub-link and N representing the last sub-link. In this embodiment, the $i^{th}$ resistance link of the two-port resistance network comprises the $i^{th}$ sub-link $U_{i1}$ of the first sub-chain L1, the $i^{th}$ sub-link $U_{i2}$ of the second sub-chain L2, and a jumper resistance $5i$.

The $i^{th}$ sub-link $U_{i1}$ of the first sub-chain L1 comprises a first sub-unit $3i11$, which comprises a first portion of a first conductive layer 201 contacting the first node $3i1$ of the $i^{th}$ resistance link; a second sub-unit $3i12$, which comprises a first portion of a second conductive layer 202; a third sub-unit $3i13$, which comprises a second portion of the first conductive layer 201 contacting the second node $3i2$ of the $i^{th}$ resistance link; a fourth sub-unit $3i14$, which comprises a first inter-layer component connecting the first sub-unit $3i11$ and the second sub-unit $3i12$; and a fifth sub-unit $3i15$, which comprises a second inter-layer component connecting the second sub-unit $3i12$ and the third sub-unit $3i13$.

Similarly, the $i^{th}$ sub-link $U_{i2}$ of the second sub-chain L2 comprises a first sub-unit $4i21$, which comprises a third portion of the first conductive layer 201 contacting the fourth node $4i4$ of the $i^{th}$ resistance link; a second sub-unit $4i22$, which comprises a second portion of the second conductive layer 202; a third sub-unit $4i23$, which comprises a fourth portion of the first conductive layer 201 contacting the third node $4i3$ of the $i^{th}$ resistance link; a fourth sub-unit $4i24$, which comprises a third inter-layer component connecting the first sub-unit $4i21$ and the second sub-unit $4i22$; and a fifth sub-unit $4i25$, which comprises a fourth inter-layer component connecting the second sub-unit $4i22$ and the third sub-unit $4i23$.

Each of the first conductive layer 201 and the second conductive layer 202 may be an active layer or a metal-wired layer. Each of the first, the second, the third and the fourth inter-layer components may be a via or other types of connecting components. The jumper resistance $5i$, the first conductive layer 201, and the second conductive layer 202 may be made of a same material. For example, they may all be made of copper (Cu), aluminum (Al), or doped semiconductor materials. The jumper resistance $5i$ may also be made of a different material than that used in the first conductive layer 201 or the second conductive layer 202.

Referring to FIGS. 2 and 3A, the first equivalent resistance $R_{Oi1}$ of the $i^{th}$ resistance link may at least comprise the resistances of the first and the second inter-layer components, which is the fourth sub-unit $3i14$ and the fifth sub-unit $3i15$ of the $i^{th}$ sub-link $U_{i1}$ of the first sub-chain L1. The first equivalent resistance $R_{Oi1}$ of the $i^{th}$ resistance link may further comprise the resistances of the first sub-unit $3i11$, the second sub-unit $3i12$, and the third sub-unit $3i13$ of the $i^{th}$ sub-link $U_{i1}$ in the first sub-chain L1. The second equivalent resistance $R_{Oi2}$ of the $i^{th}$ resistance link may comprise the resistances of the third and the fourth inter-layer components, which is the fourth sub-unit $4i24$ and the fifth sub-unit $4i25$ of the $i^{th}$ sub-link $U_{i2}$ of the second sub-chain L2. The second equivalent resistance $R_{Oi2}$ of the $i^{th}$ resistance link may further comprise the resistances of the first sub-unit $4i21$, the second sub-unit $4i22$, and the third sub-unit $4i23$ of the $i^{th}$ sub-link $U_{i2}$ of the second sub-chain L2.

Each of the first, the second, the third, and the fourth equivalent resistances mainly comprises the resistances of the inter-layer components. For example, referring to FIGS. 2 and 3A, the first equivalent resistance $R_{Oi1}$ of the $i^{th}$ resistance link mainly comprises the resistance of the first inter-layer component (the fourth sub-unit $3i14$) and the second inter-layer component (the fifth sub-unit $3i15$). Other resistances, such as volume resistances, can be set to be negligible compared to the resistances of the inter-layer components. The resistance chain of this inventive concept may have other configurations and is not limited by the diagram shown in FIG. 2. For example, the equivalent resistances may comprise a combination of more than two inter-layer components.

Referring to FIG. 2, the first port 100 of the two-port resistance network comprises the first node 311 and the fourth node 414 of the first resistance link, the second port 200 of the two-port resistance network comprises the fifth node 3N5 and the sixth port 4N6 of the last (the $N^{th}$) resistance link. For all the resistance links except the last one, the second node $3i2$ and the third node $4i3$ of the $i^{th}$ resistance link is connected to the first node $3(i+1)1$ and the fourth node $4(i+1)4$ of the next (the $(i+1)^{th}$) resistance link, respectively.

Referring to FIG. 3B, in another embodiment, a second jumper resistance may be formed between the second conductive layer 202 of the $i^{th}$ sub-link $U_{i1}$ of the first sub-chain L1 and the second conductive layer 202 of the $i^{th}$ sub-link $U_{i2}$ of the second sub-chain L2. Referring to FIG. 2, the second jumper resistance may connect the corresponding nodes in the $i^{th}$ sub-link $U_{i1}$ of the first sub-chain L1 and the $i^{th}$ sub-link $U_{i2}$ of the second sub-chain L2. In this embodiment, the $i^{th}$ sub-link $U_{i1}$ of the first sub-chain L1 comprises a first sub-unit $3i11$, which comprises a first portion of the first conductive layer 201 connecting the first node $3i1$ and the second node $3i2$ of the $i^{th}$ resistance link; a second sub-unit $3i12$, which comprises a first portion of the second conductive layer 202; and a third sub-unit $3i13$, which comprises a first inter-layer component connecting the first sub-unit $3i11$ and the second sub-unit $3i12$.

Similarly, the $i^{th}$ sub-link $U_{i2}$ of the second sub-chain L2 comprises a first sub-unit $4i21$, which comprises a second portion of the first conductive layer 201 connecting the third node $4i3$ and the fourth node $4i4$ of the $i^{th}$ resistance link; a second sub-unit $4i22$, which comprises a second portion of the second conductive layer 202; and a third sub-unit $4i23$, which comprises a second inter-layer component connecting the first sub-unit 4i21 and the second sub-unit 4i22.

In this embodiment, the equivalent two-port resistance network can also be represented by the diagram in FIG. 2. The first equivalent resistance $R_{Oi1}$ of the $i^{th}$ resistance link comprises the resistance of the third sub-unit 3i13 of the $i^{th}$ sub-link $U_{i1}$ in the first sub-chain L1. The second equivalent resistance $R_{Oi2}$ of the $i^{th}$ resistance link comprises the resistance of the third sub-unit 4i23 of the $i^{th}$ sub-link $U_{i2}$ in the second sub-chain L2.

FIG. 4 shows a flowchart that illustrates a method for testing inter-layer connections in accordance with one or more embodiments of this inventive concept. The procedures of the testing method in this inventive concept will be described referring to FIGS. 3A and 4. The defects to be detected may include a cavity in the inter-layer components, or other defects that may cause open circuit in the inter-layer components.

Referring to FIG. 4, in step S101, in a defect-free circumstance, measure base input resistances on at least one of the first and the second ports of the test semiconductor device for different number of resistance links N. Obtain a correspondence relationship between the number of resistance links N and the base input resistances on at least one of the first port $R_{a\_ideal}$ and the second port $R_{b\_ideal}$ of the test semiconductor device. The correspondence relationship may be obtained by interpolation or theoretical inference and may be represented by a curve or a lookup table. The correspondence relationship may also be obtained by measuring base input resistances on a defect-free calibration device, which demands a higher operational cost.

In step S103, measure an actual input resistance $R_a$ on at least one of the first and the second ports of the test semiconductor device.

In step S105, determine a position of the resistance link corresponding to the actual input resistance $R_a$ based on the correspondence relationship. For example, when the actual input resistance $R_a$ and a base input resistance when the number of resistance links is j satisfies a condition, j is the position of the resistance link corresponding to the actual input resistance $R_a$. The condition may be that a ratio of the difference between the actual input resistance $R_a$ and the base input resistance $R_{a\_ideal}$ to the actual input resistance $R_a$ is less than a threshold. Other conditions may also be used here.

In another embodiment, referring to FIG. 2, the first equivalent resistance $R_{Oi1}$ and the second equivalent resistance $R_{Oi2}$ in each resistance link are the same and both equal to a unit resistance $R_0$. The jumper resistance $R_i$ in each resistance link may be set to be m times of the first equivalent resistance $R_{Oi1}$ ($R_i = mR_0$), wherein m is a positive coefficient. Optimally, m may be a large number to make the jumper resistance $R_i$ much larger than the unit resistance $R_0$, for example, m may be greater than 50.

Figure 5:
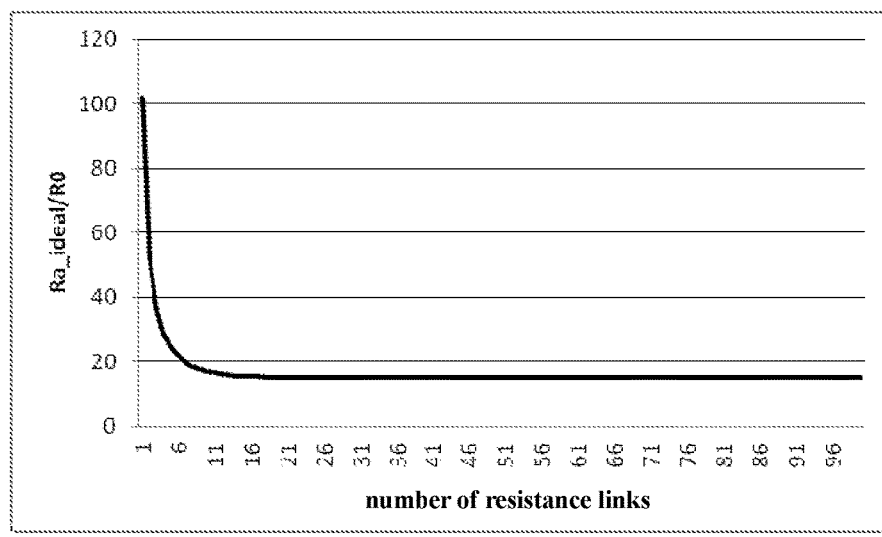
FIG. 5 shows a diagram depicting a relationship between a number of resistance links and a ratio of a base input resistance at a first port of a test semiconductor device to a unit resistance in a method for testing inter-layer connections in accordance with one or more embodiments of this inventive concept.

Referring to FIG. 4, in step S101, in a defect-free circumstance, measure base input resistances on at least one of the first and the second ports of the test semiconductor device for different number of resistance links N. Obtain a correspondence relationship between the number of resistance links N with the ratio of the base input resistance in one of the first port $R_{a\_ideal}$ and the second port $R_{b\_ideal}$ of the test semiconductor device to the unit resistance $R_0$. FIG. 5 shows a diagram depicting an example of the correspondence relationship between the number of resistance links N and the ratio of the base input resistance on the first port $R_{a\_ideal}$ to the unit resistance $R_0$ when m=100. In FIG. 5, x-axis represents the number of resistance links N and y-axis represents the ratio of the base input resistance at the first port $R_{a\_ideal}$ to the unit resistance $R_0$.

In step S103, measure actual input resistances on at least one of the first and the second ports of the test semiconductor device. For example, the actual input resistance on the first port of the test semiconductor device $R_a$ may be measured. Compute the ratio of the actual input resistance at the first port $R_a$ to the unit resistance $R_0$.

In step S105, determine a position of the resistance link corresponding to the actual input resistance $R_a$ based on the correspondence relationship by comparing the ratio of the base input resistance $R_{a\_ideal}$ to the unit resistance $R_0$ with the ratio of the actual input resistance $R_a$ to the unit resistance $R_0$. The position of the resistance link corresponding to the actual input resistance determines a defect location and can be found by comparing the ratios of the base input resistances $R_{a\_ideal}$ to the unit resistance $R_0$ under different number of resistance links with the ratio of the actual input resistance $R_a$ to the unit resistance $R_0$. If the position of the resistance link corresponding to the actual input resistance $R_a$ is j and j is not equal to N, then the defect is located on the $(j+1)^{th}$ resistance link. Here, j is an integer representing the position of corresponding resistance link and is in a range of from 1 to N.

This test method can locate a defect in the inter-layer connection faster than conventional test methods.

In another embodiment of this inventive concept, the first equivalent resistance $R_{Oi1}$ and the second equivalent resistance $R_{Oi2}$ in each resistance link are substantially the same and both equal to the unit resistance $R_0$. The jumper resistance $R_i$ in each resistance link is k(i) times of the first equivalent resistance $R_{Oi1}$ of the resistance link, where k(i) is a coefficient that satisfies the following conditions:

1. when i=1, k(i)=m, where m>0 and, optimally, m>50;
2. when 2≤i≤s, wherein s is an integer and 2<s<N, k(i) has a negative correlation with i, that is, k(i) decreases as i increases. For example, the relationship may be k(i)=−a*i+b, where a>0;
3. when s<i≤N−1, k(i) has a positive correlation with i, that is, k(i) increases as i increases. For example, the relationship may be k(i)=a*(N−i)+b, where a>0, b>0, and −a*s+b=m;
4. when i=N, k(i)=m.

In one embodiment, these coefficients can be set as follows: N=100, a=120, b=6100, s=50, m=100, and k(i) is set as follows:

1. when i=1, k(1)=100;
2. when 2≤i≤50, k(i)=−120*i+6100;
3. when 50<i≤99, k(i)=120*(100−i)+6100;
4. when i=100, k(100)=100.

Figure 6:
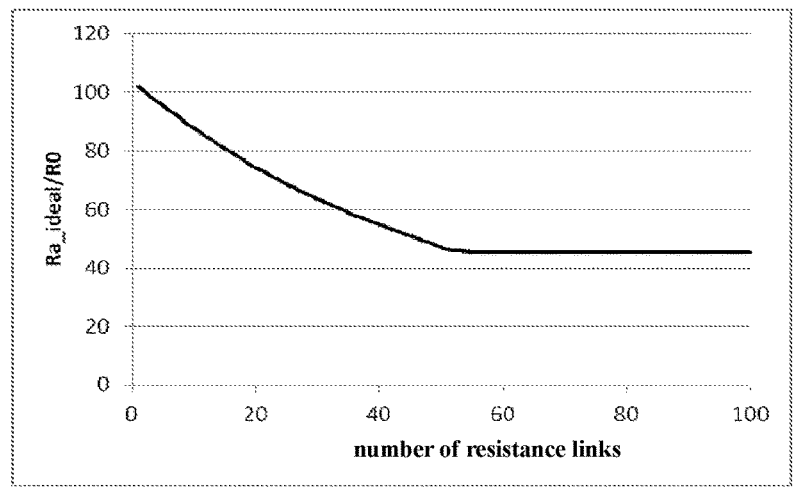
FIG. 6 shows another diagram depicting a relationship between a number of resistance links and a ratio of a base input resistance at a first port of a test semiconductor device to a unit resistance in a method for testing inter-layer connections in accordance with one or more embodiments of this inventive concept.

Based on this setting of k(i), in step S101, in a defect-free circumstance, measure base input resistances on the first port of the test semiconductor device $R_{a\_ideal}$ for different number of resistance links, obtain a correspondence relationship between the number of resistance links N and the ratios of the base input resistances $R_{a\_ideal}$ to the unit resistance $R_0$. FIG. 6 shows a diagram depicting this correspondence relationship. In FIG. 6, x-axis represents the number of resistance links N and y-axis represents the ratio of the base input resistance $R_{a\_ideal}$ to the unit resistance $R_0$. After the correspondence relationship is obtained, the defect location can be found by similar procedures described in step S105 above.

Comparing to the curve in FIG. 5, the curve in FIG. 6 decreases slower, thus provides a larger detection range. As a comparison, the curve in FIG. 5 drops rapidly when the number of resistance links increases from 1 to 10, which makes it difficult to detect defect located beyond the 10$^{th}$ resistance link.

Figure 7:
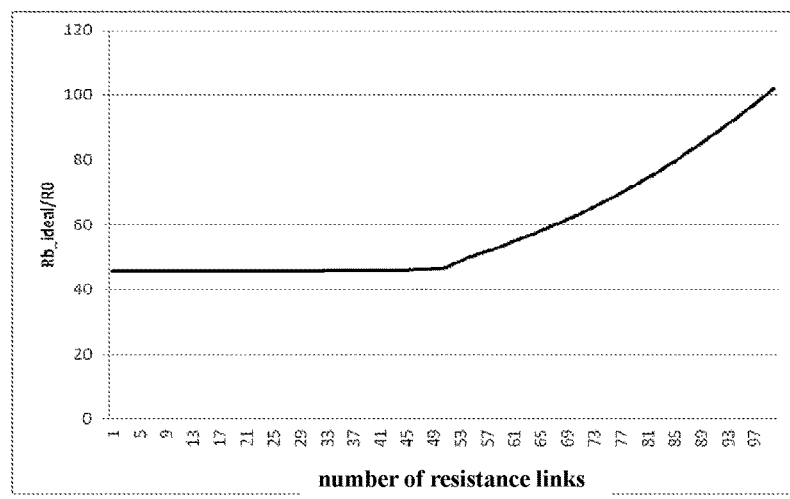
FIG. 7 shows a diagram depicting a relationship between a number of resistance links and a ratio of a base input resistance at a second port of a test semiconductor device to a unit resistance in a method for testing inter-layer connections in accordance with one or more embodiments of this inventive concept.

When the position of the resistance link corresponding to the actual input resistance is larger than a threshold, it becomes difficult to detect a defect. For example, as shown in FIG. 6, when the position of the resistance link corresponding to the actual input resistance is greater than 50, it becomes difficult to determine a defect location due to the flatness of the curve. In that circumstance, the defect location may be found by measuring the actual input resistance in the second port of the test semiconductor device $R_b$ and using the correspondence relationship between the number of resistance links N and the ratio of the base input resistance on the second port of the test semiconductor device $R_{b\_ideal}$ to the unit resistance $R_0$ to determine the corresponding position of the resistance link. For example, FIG. 7 shows a diagram depicting the correspondence relationship between the number of resistance links N and the ratio of the base input resistance on the second port of the test semiconductor device $R_{b\_ideal}$ to the unit resistance $R_0$ for a test semiconductor device having the same parameter setting as described in FIG. 6. The curve in FIG. 7 may be used to detect a defect located in a higher number of resistance link (for example, larger than 50).

Figure 8:
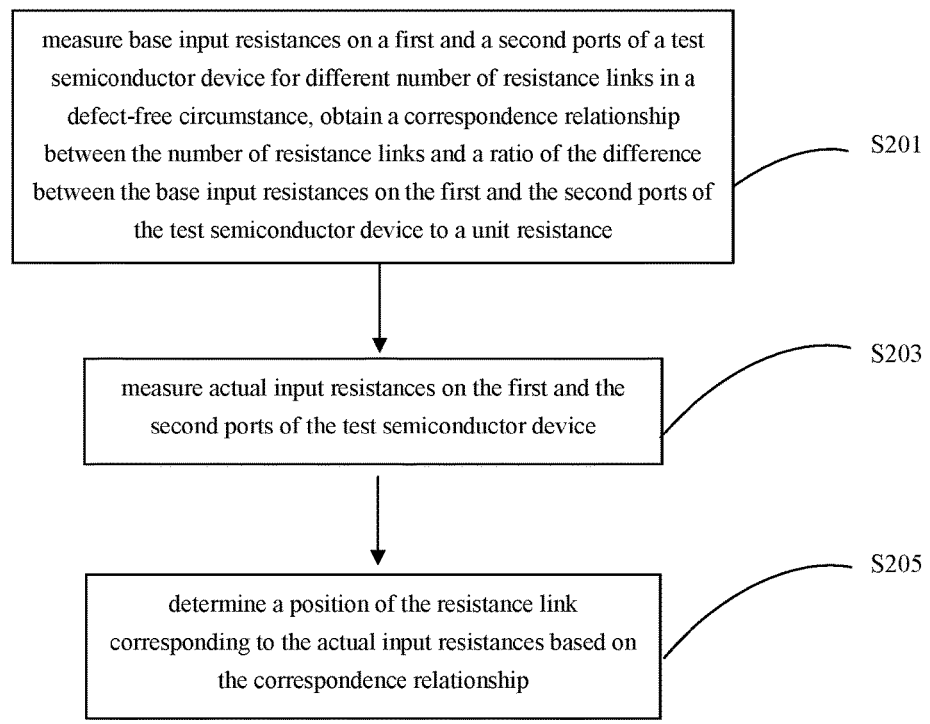
FIG. 8 shows a second flowchart illustrating the procedures in a method for testing inter-layer connections in accordance with one or more embodiments of this inventive concept.
Figure 9:
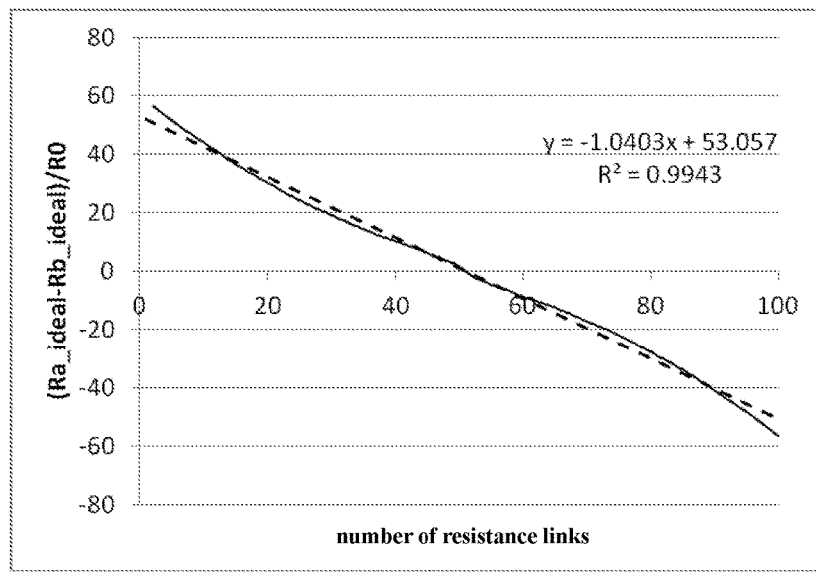
FIG. 9 shows a diagram depicting a relationship between a number of resistance links and a ratio of the difference between base input resistances at a first and a second ports of a test semiconductor device to a unit resistance in a method for testing inter-layer connections in accordance with one or more embodiments of this inventive concept.

Referring to FIG. 8, in another embodiment, in step S201, in a defect-free circumstance, measure the base input resistances on the first port $R_{a\_ideal}$ and the second port $R_{b\_ideal}$ of the test semiconductor device, obtain a correspondence relationship between the number of resistance links N and a ratio of a difference between the base input resistances at the first and the second ports $R_{a\_ideal} - R_{b\_ideal}$ to the unit resistance $R_0$. FIG. 9 shows a diagram depicting the correspondence relationship between the number of resistance links N and the ratio of the difference between the base input resistances at the first and the second ports $R_{a\_ideal} - R_{b\_ideal}$ to the unit resistance $R_0$ for a test semiconductor device having the same parameter setting as described in FIG. 6.

Optimally, by choosing proper values for parameters a, b, s, and m, the curve depicting the relationship between the number of resistance links N and the ratio of the difference between the base input resistances at the first and the second ports $R_{a\_ideal} - R_{b\_ideal}$ to the unit resistance $R_0$ can be a substantially straight line (the dash line shown in FIG. 9). This allows a wide detection range so that a defect can be promptly located.

In step S203, measure actual input resistances on the first port $R_a$ and the second ports $R_b$ of the test semiconductor device.

In step S205, determine a position of the resistance link corresponding to the actual input resistances on the first port $R_a$ and the second port $R_b$ of the test semiconductor device based on the correspondence relationship between the number of resistance links N and the ratio of the difference of the actual input resistances at the first and the second ports $R_{a\_ideal} - R_{b\_ideal}$ to the unit resistance $R_0$.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may determine utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A method for testing inter-layer connections, comprising:
    providing a test semiconductor device, wherein the test semiconductor device comprises a two-port resistance network connecting a first port and a second port of the test semiconductor device, wherein the two-port resistance network comprises a resistance chain comprising a plurality of resistance links that are serially connected, wherein each of the resistance links comprises:
    a first node;
    a second node;
    a third node;
    a fourth node;
    a first equivalent resistance connecting the first node and the second node;
    a second equivalent resistance connecting the third node and the fourth node; and
    a jumper resistance connecting the second node and the third node,
    wherein a last resistance link of the resistance chain further comprises:
    a fifth node;
    a sixth node;
    a third equivalent resistance connecting the second node and the fifth node; and
    a fourth equivalent resistance connecting the third node and the sixth node,
    wherein each of the first, the second, the third, and the fourth equivalent resistances comprises resistances of inter-layer components,
    and wherein the first port of the test semiconductor device comprises the first node and the fourth node of a first resistance link of the resistance chain, the second port of the test semiconductor device comprises the fifth node and the sixth node of the last resistance link of the resistance chain, and for all the resistance links except the last resistance link, the second node and the third node of a resistance link is connected to the first node and the fourth node of a next resistance link, respectively;
    obtaining a correspondence relationship between a number of resistance links and base input resistances on at least one of the first and the second ports of the test semiconductor device, wherein the base input resistances are measured in a defect-free circumstance;
    measuring actual input resistances on at least one of the first and the second ports of the test semiconductor device; and
    determining a position of the resistance link corresponding to the actual input resistances based on the correspondence relationship, wherein the position of the resistance link determines a location of a defect.

2. The method of claim 1, wherein the two-port resistance network comprises a first sub-chain and a second sub-chain, wherein the first sub-chain and the second sub-chain each comprise a plurality of sub-links that are serially connected,
    wherein each resistance link in the resistance chain comprises a sub-link in the first sub-chain, a sub-link in the second sub-chain, and a jumper resistance, wherein the sub-link in the first sub-chain comprises:
    a first sub-unit comprising a first portion of a first conductive layer;
    a second sub-unit comprising a first portion of a second conductive layer; and a third sub-unit comprising a first inter-layer component connecting the first sub-unit and the second sub-unit, wherein the first sub-unit, the second sub-unit, and the third sub-unit are serially connected and connecting the first node and the second node of the resistance link, and wherein the sub-links in the second sub-chain comprises:
- a first sub-unit comprising a second portion of the first conductive layer;
- a second sub-unit comprising a second portion of the second conductive layer; and
- a third sub-unit comprising a second inter-layer component connecting the first sub-unit and the second sub-unit, wherein the first sub-unit, the second sub-unit, and the third sub-unit are serially connected and connecting the third node and the fourth node of the resistance link.

3. The method of claim 2, wherein the first equivalent resistance in each of the resistance links comprises a resistance of the first inter-layer component of the sub-link in the first sub-chain, the second equivalent resistance in each of the resistance links comprises a resistance of the second inter-layer component of the sub-link in the second sub-chain.

4. The method of claim 1, wherein the two-port resistance network comprises a first sub-chain and a second sub-chain, wherein the first sub-chain and the second sub-chain each comprise a plurality of sub-links that are serially connected, wherein each of the resistance links comprises a sub-link in the first sub-chain, a sub-link in the second sub-chain, and a jumper resistance, wherein the sub-link in the first sub-chain comprises:
- a first sub-unit comprising a first portion of a first conductive layer contacting the first node of the resistance link;
- a second sub-unit comprising a first portion of a second conductive layer;
- a third sub-unit comprising a second portion of the first conductive layer contacting the second node of the resistance link;
- a fourth sub-unit comprising a first inter-layer component connecting the first sub-unit and the second sub-unit; and
- a fifth sub-unit comprising a second inter-layer component connecting the second sub-unit and the third sub-unit, and wherein the sub-link in the second sub-chain comprises:
- a first sub-unit comprising a third portion of the first conductive layer contacting the fourth node of the resistance link;
- a second sub-unit comprising a second portion of the second conductive layer;
- a third sub-unit comprising a fourth portion of the first conductive layer contacting the third node of the resistance link;
- a fourth sub-unit comprising a third inter-layer component connecting the first sub-unit and the second sub-unit; and
- a fifth sub-unit comprising a fourth inter-layer component connecting the second sub-unit and the third sub-unit.

5. The method of claim 4, wherein the first equivalent resistance in each of the resistance links comprises resistances of the first and the second inter-layer components of the sub-link in the first sub-chain, the second equivalent resistance in each of the resistance links comprises resistances of the third and the fourth inter-layer components of the sub-link in the second sub-chain.

6. The method of claim 1, wherein the first equivalent resistance and the second equivalent resistance in each of the resistance links are substantially the same and both equal to a unit resistance, the jumper resistance is m times the first equivalent resistance wherein m is a positive number, and wherein obtaining the correspondence relationship between the number of resistance links and the base input resistances on at least one of the first and the second ports of the test semiconductor device comprises:
- measuring the base input resistances on at least one of the first and the second ports of the test semiconductor device for different number of resistance links in a defect-free circumstance; and
- obtaining the correspondence relationship between the number of resistance links and a ratio of the base input resistances to the unit resistance.

7. The method of claim 1, wherein the first equivalent resistance and the second equivalent resistance in each of the resistance links are substantially the same and both equal to a unit resistance, the jumper resistance equals to the first equivalent resistance multiplied by a coefficient $k(i)$, wherein i is an integer representing a position of a resistance link in the resistance chain and is greater than or equal to 1 but less than or equal to the total number of resistance links N, wherein the coefficient $k(i)$ satisfies the following conditions:
- when $i=1$, $k(i)=m$, wherein $m>0$;
- when $2 \leq i \leq s$, wherein s is an integer and $2<s<N$, $k(i)$ has a negative correlation with i, that is, $k(i)$ decreases as i increases;
- when $s<i \leq N-1$, $k(i)$ has a positive correlation with i, that is, $k(i)$ increases as i increases; and
- when $i=N$, $k(i)=m$.

8. The method of claim 7, wherein the coefficient $k(i)$ in each of the resistance links further satisfies the following conditions:
- when $2 \leq i \leq s$, $k(i)=-a*i+b$;
- when $s<i \leq N-1$, $k(i)=a*(N-i)+b$, wherein $a>0$, $b>0$, and $-a*s+b=m$.

9. The method of claim 1, wherein obtaining the correspondence relationship between the number of resistance links and the base input resistances on at least one of the first and the second ports of the test semiconductor device comprises:
- measuring the base input resistances on the first port of the test semiconductor device for different number of resistance links in a defect-free circumstance; and
- obtaining the correspondence relationship between the number of resistance links and the base input resistances on the first port of the test semiconductor device, and wherein measuring the actual input resistances on at least one of the first and the second ports of the test semiconductor device comprises:
- measuring the actual input resistance on the first port of the test semiconductor device.

10. The method of claim 1, wherein obtaining the correspondence relationship between the number of resistance links and the base input resistances on at least one of the first and the second ports of the test semiconductor device comprises:
- measuring the base input resistances on the first and the second ports of the test semiconductor device for different number of resistance links in a defect-free circumstance; and obtaining the correspondence relationship between the number of resistance links and the base input resistances on the first and the second ports of the test semiconductor device, wherein measuring the actual input resistances on at least one of the first and the second ports of the test semiconductor device comprises:

measuring the actual input resistances on the first and the second ports of the test semiconductor device, and wherein determining the position of the resistance link corresponding to the actual input resistances based on the correspondence relationship comprises:

comparing the actual input resistance on the first port and the base input resistances on the first port to determine the position of the resistance link corresponding to the actual input resistance on the first port of the test semiconductor device; and comparing the actual input resistance on the second port and the base input resistances on the second port to determine the position of the resistance link corresponding to the actual input resistance on the second port of the test semiconductor device.

11. The method of claim 1, wherein determining the position of the resistance link corresponding to the actual input resistances based on the correspondence relationship comprises:

when the actual input resistance and a base input resistance at a given number of resistance links satisfies a condition, the given number of resistance links is the position of the resistance link corresponding to the actual input resistance.

12. The method of claim 1, wherein the correspondence relationship is represented by either a curve or a lookup table.

13. The method of claim 11, wherein the condition comprises:

the ratio of a first number to the actual input resistance is less than a threshold, wherein the first number is an absolute value of the difference between the actual input resistance and the base input resistance at a given number of resistance links.

14. The method of claim 1, wherein if the position of the resistance link corresponding to the actual input resistance is not a position of the last resistance link, the defect is located on a next resistance link that is serially connected to the resistance link corresponding to the actual input resistance.

15. The method of claim 9, wherein if the the position of the resistance link corresponding to the actual input resistance is a position of the last resistance link or is larger than a threshold, the method further comprises:

a second measure procedure comprising measuring a second actual input resistance on the second port of the test semiconductor device; and determining a position of a resistance link corresponding to the second actual input resistance based on the correspondence relationship.

16. The method of claim 9, wherein obtaining the correspondence relationship between the number of resistance links and the base input resistances on at least one of the first and the second ports of the test semiconductor device further comprises:

measuring the base input resistances on the first and the second ports of the test semiconductor device for different number of resistance links in a defect-free circumstance; and obtaining the correspondence relationship between the number of resistance links and a ratio of the difference between the base input resistances on the first and the second ports of the test semiconductor device to a unit resistance, wherein measuring the actual input resistances on at least one of the first and the second ports of the test semiconductor device comprises:

measuring the actual input resistances on the first and the second ports of the test semiconductor device, and wherein determining the position of the resistance link corresponding to the actual input resistance based on the correspondence relationship comprises:

comparing the ratio of the different between the actual input resistances in the first and the second ports of the test semiconductor device to the unit resistance and the ratios of the differences between the base input resistances on the first and the second ports of the test semiconductor device to the unit resistance to determine the position of the resistance link corresponding to the actual input resistances on the first and the second ports of the test semiconductor device.

17. The method of claim 1, wherein the defect comprises a cavity in the inter-layer components.

18. The method of claim 1, wherein the defect comprises an open circuit in the inter-layer components.

19. The method of claim 2, wherein each of the first conductive layer and the second conductive layer is an active layer or a metal-wired layer.

20. The method of claim 2, wherein the jumper resistance, the first conductive layer, and the second conductive layer in each of the resistance links are made of a same material.

* * * * *